United States Patent
Zhang (10) Patent No.: US 10,186,328 B2
(45) Date of Patent: Jan. 22, 2019

(54) CURRENT SAMPLING AND HOLDING CIRCUIT AND SIGNAL ACQUISITION SYSTEM

(71) Applicant: SHENZHEN GOODIX TECHNOLOGY CO., LTD., Shenzhen (CN)

(72) Inventor: Mengwen Zhang, Shenzhen (CN)

(73) Assignee: SHENZHEN GOODIX TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 15/690,333

(22) Filed: Aug. 30, 2017

(65) Prior Publication Data

US 2018/0053564 A1 Feb. 22, 2018

Related U.S. Application Data

(63) Continuation of application No. PCT/CN2016/095465, filed on Aug. 16, 2016.

(51) Int. Cl.
*G11C 27/02* (2006.01)
*H03K 17/687* (2006.01)

(52) U.S. Cl.
CPC ............ *G11C 27/02* (2013.01); *G11C 27/028* (2013.01); *H03K 17/6872* (2013.01)

(58) Field of Classification Search
CPC .... G11C 8/08; G11C 7/02; G11C 7/04; G11C 7/14; H03K 17/16; H03K 17/687; H03K 5/08
USPC .......................................... 327/94, 103, 109
See application file for complete search history.

(56) References Cited

U.S. PATENT DOCUMENTS

| | | | |
|---|---|---|---|
| 5,023,489 A | 6/1991 | Macbeth | |
| 5,760,616 A | 6/1998 | Vallancourt | |
| 6,011,414 A * | 1/2000 | Majid | H02M 3/33507 327/94 |
| 7,701,734 B2 * | 4/2010 | Li | H02M 3/33507 363/21.08 |

(Continued)

FOREIGN PATENT DOCUMENTS

| | | |
|---|---|---|
| CN | 1234902 A | 11/1999 |
| CN | 1720661 A | 1/2006 |
| CN | 101629973 A | 1/2010 |

(Continued)

*Primary Examiner* — John W Poos (57) ABSTRACT

A current sampling and holding circuit is disclosed. The current sampling and holding circuit includes: a canceling circuit, connected in series between a VDD terminal and a current sensor, being conducted according to a first enable signal, and configured to output a current to cancel a direct-current component in the current sensor; and a mirroring circuit, connected in parallel between the VDD terminal and a ground voltage with the canceling circuit and the current sensor connected in series, and being conducted according to a second enable signal inverse to the first enable signal, and configured to perform current transfer according to a current difference between a mirror current of a shunt current and an output current of the current sensor. According to the present application, the setup speed of the current sampling and holding circuit is improved, and the noise output by the current sampling and holding circuit is reduced.

10 Claims, 2 Drawing Sheets

(56) References Cited

U.S. PATENT DOCUMENTS

2010/0158055 A1* 6/2010 Giebel ............... G06K 7/10584
372/29.011
2013/0154714 A1* 6/2013 Friend .................... H03K 17/56
327/362

FOREIGN PATENT DOCUMENTS

| CN | 101677022 A | 3/2010 |
| CN | 101840241 A | 9/2010 |
| CN | 102257509 A | 11/2011 |

* cited by examiner

CURRENT SAMPLING AND HOLDING CIRCUIT AND SIGNAL ACQUISITION SYSTEM

CROSS REFERENCE TO RELATED APPLICATIONS

The present application is a continuation of international application No. PCT/CN2016/095465 filed on Aug. 16, 2016, which is hereby incorporated by reference in its entirety.

TECHNICAL FIELD

The present application relates to the technical field of current sampling and holding, and in particular, relates to a current sampling and holding circuit and a signal acquisition system.

BACKGROUND

Figure 1:
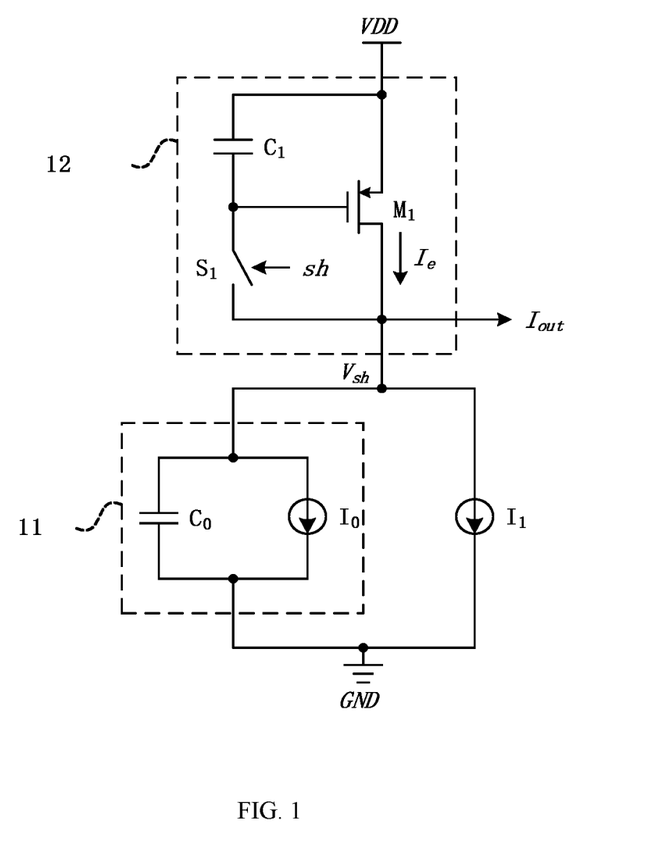
FIG. 1 is a schematic structural diagram of a current sampling and holding circuit according to an embodiment of the related art.

Referring to FIG. 1, in a signal acquisition system, a current sensor 11 outputs an alternating-current component of current, and therefore a canceling circuit 12 is generally arranged to acquire and cancel a direct-current component of the output current of the current sensor 11. However, limited setup time of the canceling circuit 12 may affect the wait time of the subsequent circuits, thereby lowering the efficiency of the entire signal acquisition system.

However, at the stage of sampling, when a first enable signal sh is high, and a first switch S1 is closed, a gate and a drain of a first P-type MOS transistor M1 are short-circuited. Therefore, the first P-type MOS transistor M1 is functionally equivalent to a resistance having a resistance of 1/gm1. gm1 is a transconductance of the first P-type MOS transistor M1. The equivalent resistor forms a time constant $\tau 1=(C0+C1)/gm1$ (formula 1), with a first capacitor C1 and a capacitor C0 of the current sensor. Therefore, when the transconductance gm1 of the first P-type MOS transistor M1 is small and the capacitance of the capacitor C0 of the current sensor is great, the time constant $\tau 1$ may be very great, such that the setup speed of the canceling circuit 12 is lower. In addition, to improve the setup speed of the canceling circuit 12, a general approach is to add a bias current source I1, such that the direct current flowing through the first P-type MOS transistor M1 is increased, and thus the transconductance gm1 of the first P-type MOS transistor M1 is increased, so as to finally reduce the time constant $\tau 1$ and improve the setup speed of the canceling circuit 12. However, a large amount of current noise may be introduced after the bias current is increased, which thereby affects the signal-to-noise ratio of the signal acquisition system.

Therefore, it may be a technical problem to be urgently solved in the related art as how to better implement current sampling and holding.

SUMMARY

In view of the above technical problem, the present application provides a current sampling and holding circuit and a signal acquisition system, to thoroughly or partially solve the above technical problem.

According to a first aspect of the present application, a current sampling and holding circuit is provided. The current sampling and holding circuit includes:

a canceling circuit, connected in series between a VDD terminal and a current sensor, being conducted according to a first enable signal, and configured to output a current to cancel a direct-current component in the current sensor; and a mirroring circuit, connected in parallel between the VDD terminal and a ground voltage with the canceling circuit and the current sensor connected in series, and being conducted according to a second enable signal inverse to the first enable signal, and configured to perform current transfer according to a current difference between a mirror current of a shunt current and an output current of the current sensor.

According to a second aspect of the present application, a signal acquisition system having a current sampling and holding circuit is provided. The signal acquisition system includes: a current sampling and holding circuit and a current sensor. The current sampling and holding circuit includes:

a canceling circuit, connected in series between a VDD terminal and a current sensor, being conducted according to a first enable signal, and configured to output a current to cancel a direct-current component in the current sensor; and a mirroring circuit, connected in parallel between the VDD terminal and a ground voltage with the canceling circuit and the current sensor connected in series, and being conducted according to a second enable signal inverse to the first enable signal, and configured to perform current transfer according to a current difference between a mirror current of a shunt current and an output current of the current sensor.

The current sampling and holding circuit and the signal acquisition system according to the present application, based on a canceling circuit and a mirroring circuit, maintains great currents of various current branches to which the current sensor is connected, and ensures the setup speed of various nodes by means of transferring current differences. In this way, the setup speed of the current sampling and holding circuit may be improved, and the noise output by the current sampling and holding circuit may be reduced. In addition, the current sampling and holding circuit according to the present application may have characteristics of greater dynamic range and unconditional stability.

The above description only summarizes the technical solutions of the present application. Specific embodiments of the present application are described hereinafter to better and clearer understand the technical solutions of the present application, to practice the technical solutions based on the disclosure of the specification and to make the above and other objectives, features and advantages of the present application more apparent and understandable.

BRIEF DESCRIPTION OF THE DRAWINGS

By reading the detailed description of preferred embodiments hereinafter, various other advantages and beneficial effects become clear and apparent for persons of ordinary skill in the art. The accompanying drawings are merely for illustrating the preferred embodiments, but shall not be construed as limiting the present application. In all the accompanying drawings, like reference signs denote like parts. In the drawings.

DETAILED DESCRIPTION

Some exemplary embodiments of the present application are hereinafter described in detail with reference to the accompanying drawings. Although the accompanying drawings illustrate the exemplary embodiments of the present application, it shall be understood that the present application may be practiced in various manners, and the present application shall not be limited by the embodiments illustrated herein. On the contrary, these embodiments are described herein only for the purpose of better understanding the present application, and may integrally convey the scope of the present application to a person skilled in the art.

Figure 2:
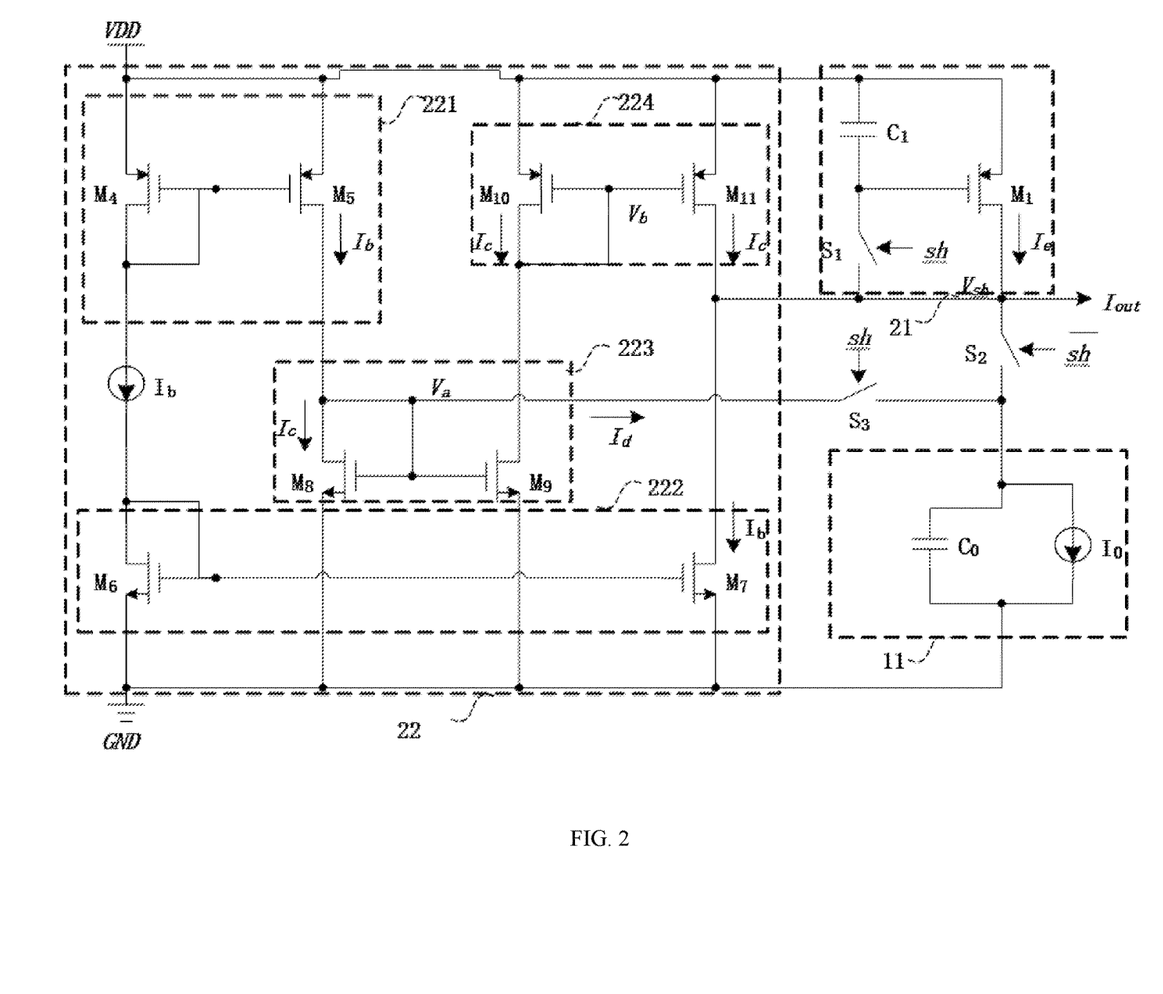
FIG. 2 is a schematic structural diagram of a current sampling and holding circuit according to an embodiment of the present application.

Referring to FIG. 2, one embodiment of the present application provides a current sampling and holding circuit. The current sampling and holding circuit includes:

a canceling circuit 21, connected in series between a VDD terminal and a current sensor 11, being conducted according to a first enable signal, and configured to output a current to cancel a direct-current component in the current sensor 11; and a mirroring circuit 22, connected in parallel between the VDD terminal and a ground voltage with the canceling circuit 21 and the current sensor 11 connected in series, and being conducted according to a second enable signal inverse to the first enable signal, and configured to perform current transfer according to a current difference between a mirror current of a shunt current and an output current of the current sensor 11.

The canceling circuit 21, when being conducted according to the first enable signal, cancels the direct-current component in the current sensor 11; and the mirroring circuit 22, when being conducted according to the second enable signal inverse to the first enable signal, maintains great currents of various current branches to which the current sensor 11 is connected, ensures the setup speed of various nodes by means of transferring current differences, and thus improves the setup speed of the current sampling and holding circuit. Since it is unnecessary to increase the direct current to improve the setup speed of the current sampling and holding circuit, the noise output by the current sampling and holding circuit is reduced.

In addition, a minimum operating voltage of each current branch according to the present application may reach Vgs+Vod. Vgs is a gate-source voltage, Vod is an overdrive voltage, and Vth is a threshold voltage. Generally, Vth=0.5-1 V, Vod=0.1-0.2 V, and Vgs=Vth+Vod. Thus the dynamic range of the current sampling and holding circuit may be improved.

In another specific implementation of the present application, the canceling circuit 21 includes: a first P-type MOS transistor M1, a first capacitor C1, and a first switch S1 that may be closed or conducted according to a first enable signal. A source of the first P-type MOS transistor M1 is connected to the VDD terminal, a gate of the first P-type MOS transistor M1 is connected to one terminal of the first capacitor C1 and one terminal of the first switch S1, a drain of the first P-type MOS transistor M1 is connected to the current sensor, the other terminal of the first capacitor C1 is connected to the VDD terminal, and the other terminal of the first switch is connected to a current output terminal.

Specifically, the canceling circuit 21 may employ the same circuit structure as the conventional canceling circuit 12 in FIG. 1 and is conducted according to a first enable signal, the first switch S1 is closed or conducted according to the first enable signal, and the drain of the first P-type MOS transistor M1 is connected to an output of the current sensor 11 to cancel a direct-current component in the current sensor 11.

In still another specific implementation of the present application, the current sampling and holding circuit further includes a second switch S2. One terminal of the second switch S2 is connected to the drain of the first P-type MOS transistor M1 and the other terminal of the second switch S2 is connected to the current sensor 11. The second switch S2 is configured to turn on according to the first enable signal to conduct the canceling circuit 21, or the second switch S2 is configured to turn off when the first enable signal is to disconnect the canceling circuit.

In the present application, the second switch S2 is used to turn on according to the first enable signal to conduct the canceling circuit 21, which is convenient for operation and control and has a simpler circuit design.

In still another implementation of the present application, the current sampling and holding circuit further includes a third switch S3. One terminal of the third switch S3 is connected to the current sensor 11 and the second switch S2 and the other terminal of the third switch S3 is connected to the mirroring circuit 22. The third switch S3 is configured to turn on according to the second enable signal to conduct the mirroring circuit 22, or the third switch S3 is configured to turn off when the second enable signal is to disconnect the mirroring circuit.

In the present application, the third switch S3 is configured to turn on according to the second enable signal to conduct the mirroring circuit 22, which is convenient for operation and control and has a simpler circuit design.

The mirroring circuit 22 includes: a first current mirror circuit 221, a second current mirror circuit 222, a third current mirror circuit 223, and a fourth current mirror circuit 224. The first current mirror circuit 221 and the second current mirror circuit 222 are connected in series between the VDD terminal and the ground voltage. One terminal of the third current mirror circuit 223 is connected to the first current mirror circuit 221, and the other terminal of the third current mirror circuit 223 is connected to the ground voltage. One terminal of the fourth current mirror circuit 224 is connected to the VDD terminal, and the other terminal of the fourth current mirror circuit 224 is connected to the second current mirror circuit 222.

In the present application, current transfer is performed according to current differences generated by the first current mirror circuit 221, the second current mirror circuit 222, the third current mirror circuit 223 and the fourth current mirror circuit 224, which improves the setup speed of the current sampling and holding circuit.

In another specific implementation of the present application, the mirroring circuit 22 includes: a fourth P-type MOS transistor M4, a fifth P-type MOS transistor M5, a sixth N-type MOS transistor M6, a seventh N-type MOS transistor M7, an eighth N-type MOS transistor M8, a ninth N-type MOS transistor M9, a tenth P-type MOS transistor M10, and an eleventh P-type MOS transistor M11; wherein a source of the fourth P-type MOS transistor M4 is connected to the VDD terminal, a gate of the fourth P-type MOS transistor M4 is connected to the mirroring circuit and a drain of the fourth P-type MOS transistor M4, and the drain of the fourth P-type MOS transistor M4 is connected to a drain and a gate of the sixth N-type MOS transistor M6; the gate of the sixth N-type MOS transistor M6 is further connected to the mirroring circuit, and a source of the sixth N-type MOS transistor M6 is connected to the ground voltage; a source of the fifth P-type MOS transistor M5 is connected to the VDD terminal, a gate of the fifth P-type MOS transistor M5 is connected to the gate and the drain of the fourth P-type MOS transistor M4, and a drain of the fifth P-type MOS transistor M5 is connected to a drain of the eighth N-type MOS transistor M8 and one terminal of the third switch S3; the fifth P-type MOS transistor M5 is configured to mirror the fourth P-type MOS transistor M4; a source of the seventh N-type MOS transistor M7 is connected to the ground voltage, a gate of the seventh N-type MOS transistor M7 is connected to the gate and the drain of the sixth N-type MOS transistor M6, a drain of the seventh N-type MOS transistor M7 is connected to a drain and a current output terminal of the eleventh P-type MOS transistor M11; the seventh N-type MOS transistor M7 is configured to mirror the sixth N-type MOS transistor M6; a source of the eighth N-type MOS transistor M8 is connected to the ground voltage, a gate of the eighth N-type MOS transistor M8 is connected to a gate of the ninth N-type MOS transistor M9; a source of the ninth N-type MOS transistor M9 is connected to the ground voltage, and a drain of the ninth N-type MOS transistor M9 is connected to a drain and a gate of the tenth P-type MOS transistor M10; the ninth N-type MOS transistor M9 is configured to mirror the eighth N-type MOS transistor M8; a source of the tenth P-type MOS transistor M10 is connected to the VDD terminal, and the gate of the tenth P-type MOS transistor M10 is connected to a gate of the eleventh P-type MOS transistor M11; a source of the eleventh P-type MOS transistor M11 is connected to the VDD terminal; and the eleventh P-type MOS transistor M11 is configured to mirror the tenth P-type MOS transistor M10.

Specifically, the mirror ratios of all the current mirrors are set as 1. Since a current source Ib, and the fourth P-type MOS transistor M4 and the sixth N-type MOS transistor M6 that are connected in series form a bias circuit 22, the fifth P-type MOS transistor M5 mirrors the fourth P-type MOS transistor M4, and the seventh N-type MOS transistor M7 mirrors the sixth N-type MOS transistor M6, drain currents of the fifth P-type MOS transistor M5 and the seventh N-type MOS transistor M7 are both Ib.

If the first enable signal is sh=1 in this case, the first switch S1 and the third switch S3 are closed, and the second switch S2 is opened. A drain current of the fifth P-type MOS transistor M5 is Ib, the current sensor 11 shunts the drain current Ib of the fifth P-type MOS transistor M5. That is, the drain current Ib of the fifth P-type MOS transistor M5 is shunt into an output current I0 of the current sensor 11 and a current Ic of the eighth N-type MOS transistor M8. Therefore, a current flowing through the eighth N-type MOS transistor M8 is Ic=Ib−I0 (formula 3). Herein assume that Ib=αI0 (formula 4), then Ic=(α−1)I0. Generally α is a positive integer far greater than 2. Therefore, a transconductance gm8 of the eighth N-type MOS transistor is far greater than a transconductance gm1 of the first P-type MOS transistor M1 in FIG. 1. In this embodiment, a time constant of node Va is $\tau2=C0/gm8$ (formula 5), and a time constant in FIG. 1 is $\tau1=(C0+C1)/gm1$ (formula 1). Therefore, $\tau2\ll\tau1$. Since $\tau2\ll\tau1$, the setup speed of the node Va and the current Ic in this embodiment is greatly improved.

Since the ninth N-type MOS transistor M9 mirrors the eighth N-type MOS transistor M8, and the eleventh P-type MOS transistor M11 mirrors the tenth P-type MOS transistor M10, drain currents of the ninth N-type MOS transistor M9, the tenth P-type MOS transistor M10 and the eleventh P-type MOS transistor M11 are all Ic. In addition, since the Vb node does not have a greater capacitance, the time constant of the Vb node is close to 0, and the setup speed of the Vb node is very quick, which may be neglected relative to the setup time of the Va node.

Since the seventh N-type MOS transistor M7 mirrors the sixth N-type MOS transistor M6, a drain current of the seventh N-type MOS transistor M7 is Ib, and the drain current Ib of the N-type MOS transistor M7 is a sum of a drain current Ic of the eleventh P-type MOS transistor M11 and a drain current Ie of the first P-type MOS transistor M1. Therefore, as seen from formula 2, the drain current of the first P-type MOS transistor M1 in this embodiment is Ie=Ib−Ic=I0 (formula 6), that is, an output current I0 of the current sensor 11. A time constant of node Vsh is $\tau3=C1/gm1$ (formula 7) in this case, and compared with capacitance of a capacitor C0 and time constant $\tau1$ of the current sensor in FIG. 1, $C1\ll C0$. Therefore, $\tau3\ll\tau1$. That is, the setup speed of the node Vsh and the drain current Ie of the first P-type MOS transistor M1 is also greatly improved.

If the second enable signal inverse to the first enable signal is s̄h=1 at this time, the first switch S1 and the third switch S3 are opened, the second switch S2 is closed, the drain of the first P-type MOS transistor M1 is connected to an output of the current sensor 11. Since the output current of the first P-type MOS transistor M1 is I0, the direct-current component in the current sensor 11 may be canceled. In this case, a current noise power spectral density of the first P-type MOS transistor M1 is INN=4 kTgm1γ (formula 8), and gm1□Ie (a subthreshold region). Therefore, as compared with improving the setup speed by increasing the current Ie in FIG. 1, the drain current Ie of the first P-type MOS transistor M1 according to the present application is much smaller, that is, the current noise according to the present disclosure may be much less.

In addition, a minimum operating voltage of each current branch according to the present application may reach Vgs+Vod. Vgs is a gate-source voltage, Vod is an overdrive voltage, and Vth is a threshold voltage. Generally, Vth=0.5-1 V, Vod=0.1-0.2 V, and Vgs=Vth+Vod. The circuit is capable of operating at an extremely low voltage, and therefore the dynamic range thereof is improved.

Since a loop circuit may cause such defects as poor circuit stability and the like, and in the present application, when the first enable signal is sh=1 and the second enable signal inverse to the first enable signal is s̄h=1, the circuit forms no loop, the stability issue is not present in the present application.

Referring to FIG. 2, another embodiment the present application provides a signal acquisition system having a current sampling and holding circuit. The signal acquisition system includes: a current sampling and holding circuit and a current sensor 11. The current sampling and holding circuit includes:

a canceling circuit 21, connected in series between a VDD terminal and a current sensor 11 and being conducted according to a first enable signal, and configured to output a current to cancel a direct-current component in the current sensor 11; and a mirroring circuit 22, connected in parallel between the VDD terminal and a ground voltage with the canceling circuit and the current sensor connected in series, and being conducted according to a second enable signal inverse to the first enable signal, and configured to perform current transfer according to a current difference between a mirror current of a shunt current and an output current of the current sensor 11.

The canceling circuit 21, when being conducted according to the first enable signal, cancels the direct-current component in the current sensor 11; and the mirroring circuit 22, when being conducted according to the second enable signal inverse to the first enable signal, maintains great currents of various current branches to which the current sensor 11 is connected by using a current source bias current output by the bias current, ensures the setup speed of various nodes by means of transferring current differences, and thus improves the setup speed of the current sampling and holding circuit. Since it is unnecessary to increase the direct current to improve the setup speed of the current sampling and holding circuit, the noise output by the current sampling and holding circuit is reduced.

In addition, a minimum operating voltage of each current branch according to the present application may reach Vgs+Vod. Vgs is a gate-source voltage, Vod is an overdrive voltage, and Vth is a threshold voltage. Generally, Vth=0.5-1 V, Vod=0.1-0.2 V, and Vgs=Vth+Vod. The circuit is capable of operating at an extremely low voltage, and therefore the dynamic range thereof is improved.

In another specific implementation of the present application, the canceling circuit 21 includes: a first P-type MOS transistor M1, a first capacitor C1, and a first switch S1 that may be closed or conducted according to a first enable signal. A source of the first P-type MOS transistor M1 is connected to the VDD terminal, a gate of the first P-type MOS transistor M1 is connected to one terminal of the first capacitor C1 and one terminal of the first switch S1, a drain of the first P-type MOS transistor M1 is connected to the current sensor, the other terminal of the first capacitor C1 is connected to the VDD terminal, and the other terminal of the first switch S1 is connected to a current output terminal.

Specifically, the canceling circuit 21 employs the same circuit structure as the conventional canceling circuit 12 in FIG. 1 and is conducted according to a first enable signal, the first switch S1 is closed or conducted according to the first enable signal, and the drain of the first P-type MOS transistor M1 is connected to an output of the current sensor 11 to cancel a direct-current component in the current sensor 11.

In still another specific implementation, the current sampling and holding circuit further includes a second switch S2. One terminal of the second switch S2 is connected to the drain of the first P-type MOS transistor M1 and the other terminal of the second switch S2 is connected to the current sensor 11. The second switch S2 is configured to turn on according to the first enable signal to conduct the canceling circuit 21, or the second switch S2 is configured to turn off when the first enable signal is to disconnect the canceling circuit 21.

In the present application, the second switch S2 is configured to turn on according to the first enable signal to conduct the canceling circuit 21, which is convenient for operation and control and has a simpler circuit design.

In still another implementation of the present application, the current sampling and holding circuit further includes a third switch S3. One terminal of the third switch S3 is connected to the current sensor 11 and the second switch S2 and the other terminal of the third switch S3 is connected to the mirroring circuit 22. The third switch S3 is configured to turn on according to the second enable signal to conduct the mirroring circuit 22, or the third switch S3 is configured to turn off when the second enable signal is to disconnect the mirroring circuit 22.

In the present application, the third switch S3 is configured to turn on according to the second enable signal to conduct the mirroring circuit 22, which is convenient for operation and control and has a simpler circuit design.

The mirroring circuit 22 includes: a first current mirror circuit 221, a second current mirror circuit 222, a third current mirror circuit 223, and a fourth current mirror circuit 224. The first current mirror circuit 221 and the second current mirror circuit 222 are connected in series between the VDD terminal and the ground voltage. One terminal of the third current mirror circuit 223 is connected to the first current mirror circuit 221, and the other terminal of the third current mirror circuit 223 is connected to the ground voltage. One terminal of the fourth current mirror circuit 224 is connected to the VDD terminal, and the other terminal of the fourth current mirror circuit 224 is connected to the second current mirror circuit 222.

In the present application, current transfer is performed according to current differences generated by the first current mirror circuit 221, the second current mirror circuit 222, the third current mirror circuit 223 and the fourth current mirror circuit 224, which improves the setup speed of the current sampling and holding circuit.

In another specific implementation of the present application, the mirroring circuit 22 includes: a fourth P-type MOS transistor M4, a fifth P-type MOS transistor M5, a sixth N-type MOS transistor M6, a seventh N-type MOS transistor M7, an eighth N-type MOS transistor M8, a ninth N-type MOS transistor M9, a tenth P-type MOS transistor M10, and an eleventh P-type MOS transistor M11; wherein a source of the fourth P-type MOS transistor M4 is connected to the VDD terminal, a gate of the fourth P-type MOS transistor M4 is connected to the mirroring circuit and a drain of the fourth P-type MOS transistor M4, and the drain of the fourth P-type MOS transistor M4 is connected to a drain and a gate of the sixth N-type MOS transistor M6; the gate of the sixth N-type MOS transistor M6 is further connected to the mirroring circuit, and a source of the sixth N-type MOS transistor M6 is connected to the ground voltage; a source of the fifth P-type MOS transistor M5 is connected to the VDD terminal, a gate of the fifth P-type MOS transistor M5 is connected to the gate and the drain of the fourth P-type MOS transistor M4, and a drain of the fifth P-type MOS transistor M5 is connected to a drain of the eighth N-type MOS transistor M8 and one terminal of the third switch S3; the fifth P-type MOS transistor M5 is configured to mirror the fourth P-type MOS transistor M4; a source of the seventh N-type MOS transistor M7 is connected to the ground voltage, a gate of the seventh N-type MOS transistor M7 is connected to the gate and the drain of the sixth N-type MOS transistor M6, a drain of the seventh N-type MOS transistor M7 is connected to a drain and a current output terminal of the eleventh P-type MOS transistor M11; the seventh N-type MOS transistor M7 is configured to mirror the sixth N-type MOS transistor M6; a source of the eighth N-type MOS transistor M8 is connected to the ground voltage, a gate of the eighth N-type MOS transistor M8 is connected to a gate of the ninth N-type MOS transistor M9; a source of the ninth N-type MOS transistor M9 is connected to the ground voltage, and a drain of the ninth N-type MOS transistor M9 is connected to a drain and a gate of the tenth P-type MOS transistor M10; the ninth N-type MOS transistor M9 is configured to mirror the eighth N-type MOS transistor M8; a source of the tenth P-type MOS transistor M10 is connected to the VDD terminal, and the gate of the tenth P-type MOS transistor M10 is connected to a gate of the eleventh P-type MOS transistor M11; a source of the eleventh P-type MOS transistor M11 is connected to the VDD terminal; and the eleventh P-type MOS transistor M11 is configured to mirror the tenth P-type MOS transistor M10.

Specifically, the mirror ratios of all the current mirrors are set as 1. Since a current source Ib, and the fourth P-type MOS transistor M4 and the sixth N-type MOS transistor M6 that are connected in series form a bias circuit 22, the fifth P-type MOS transistor M5 mirrors the fourth P-type MOS transistor M4, and the seventh N-type MOS transistor M7 mirrors the sixth N-type MOS transistor M6, drain currents of the fifth P-type MOS transistor M5 and the seventh N-type MOS transistor M7 are both Ib.

If the first enable signal is sh=1 in this case, the first switch S1 and the third switch S3 are closed, and the second switch S2 is opened. A drain current of the fifth P-type MOS transistor M5 is Ib, the current sensor 11 shunts the drain current Ib of the fifth P-type MOS transistor M5. That is, the drain current Ib of the fifth P-type MOS transistor M5 is shunt into an output current I0 of the current sensor 11 and a current Ic of the eighth N-type MOS transistor M8. Therefore, a current flowing through the eighth N-type MOS transistor M8 is Ic=Ib−I0 (formula 3). Herein assume that Ib=$\alpha$I0 (formula 4), then Ic=($\alpha$−1)I0. Generally $\alpha$ is a positive integer far greater than 2. Therefore, a transconductance gm8 of the eighth N-type MOS transistor M8 is far greater than a transconductance gm1 of the first P-type MOS transistor M1 in FIG. 1. In this embodiment, a time constant of node Va is $\tau 2$=C0/gm8 (formula 5), and a time constant in FIG. 1 is $\tau 1$=(C0+C1)/gm1 (formula 1). Therefore, $\tau 2 \ll \tau 1$. Since $\tau 2 \ll \tau 1$, the setup speed of the node Va and the current Ic in this embodiment is greatly improved.

Since the ninth N-type MOS transistor M9 mirrors the eighth N-type MOS transistor M8, and the eleventh P-type MOS transistor M11 mirrors the tenth P-type MOS transistor M10, drain currents of the ninth N-type MOS transistor M9, the tenth P-type MOS transistor M10 and the eleventh P-type MOS transistor M11 are all Ic. In addition, since the Vb node does not have a greater capacitance, the time constant of the Vb node is close to 0, and the setup speed of the Vb node is very quick, which may be neglected relative to the setup time of the Va node.

Since the seventh N-type MOS transistor M7 mirrors the sixth N-type MOS transistor M6, a drain current of the seventh N-type MOS transistor M7 is Ib, and the drain current Ib of the N-type MOS transistor M7 is a sum of a drain current Ic of the eleventh P-type MOS transistor M11 and a drain current Ie of the first P-type MOS transistor M1. Therefore, as seen from formula 2, the drain current of the first P-type MOS transistor M1 is Ie=Ib−Ic=I0 (formula 6), that is, an output current I0 of the current sensor 11. A time constant of node Vsh is $\tau 3$=C1/gm1 (formula 7) in this case, and compared with capacitance of a capacitor C0 and time constant $\tau 1$ of the current sensor in FIG. 1, C1$\ll$C0. Therefore, $\tau 3 \ll \tau 1$. That is, the setup speed of the node Vsh and the drain current Ie of the first P-type MOS transistor M1 is also greatly improved.

If the second enable signal is sh=1 at this time, the first switch S1 and the third switch S3 are opened, the second switch S2 is closed, the drain of the first P-type MOS transistor M1 is connected to an output of the current sensor 11. Since the output current of the first P-type MOS transistor M1 is I0, the direct-current component in the current sensor 11 may be canceled. In this case, a current noise power spectral density of the first P-type MOS transistor M1 is INN=4 kTgm1$\gamma$(formula 8), and gm1$\square$Ie (a subthreshold region). Therefore, as compared with improving the setup speed by increasing the current Ie in FIG. 1, the drain current Ie of the first P-type MOS transistor M1 according to the present application is much smaller, that is, the current noise according to the present disclosure may be much less.

In addition, a minimum operating voltage of each current branch according to the present application may reach Vgs+Vod. Vgs is a gate-source voltage, Vod is an overdrive voltage, and Vth is a threshold voltage. Generally, Vth=0.5-1 V, Vod=0.1-0.2 V, and Vgs=Vth+Vod. The circuit is capable of operating at an extremely low voltage, and therefore the dynamic range thereof is improved.

Since a loop circuit may cause such defects as poor circuit stability and the like, and in the present application, when the first enable signal is sh=1 and the second enable signal is sh=0, the circuit forms no loop, the stability issue is not present in the present application.

The algorithms and displays provided herein are not inherently related to any specific computer, virtual system or other device. Various general-purpose systems may also be used with the teachings herein. According to the above description, the structure required for constructing such systems is obvious. In addition, the present application is not directed to any specific programming language. It should be understood that the content of the present application described herein may be carried out utilizing various programming languages, and that the above description for a specific language is for the sake of disclosing preferred embodiments of the present application.

In the specification provided herein, a plenty of particular details are described. However, it can be appreciated that an embodiment of the present application may also be practiced without these particular details. In some embodiments, well known methods, structures and technologies are not illustrated in detail so as not to obscure the understanding of the specification.

Likewise, it shall be understood that, to streamline the present application and facilitate understanding of one or more of various aspects of the present application, in the above description of the exemplary embodiments of the present application, various features of the present application are sometimes incorporated in an individual embodiment, drawing or description thereof. However, the method according to the present application shall not be explained to embody the following intension: the present application seeking protection claims more features than those explicitly disclosed in each of the appended claims. To be more exact, as embodied in the appended claims, the inventive aspects lie in that fewer features than all the features embodied in an individual embodiment as described above. Therefore, the claims observing the specific embodiments are herein incorporated into the specific embodiments, and each claim may be deemed as an individual embodiment of the present application.

Those skilled in the art should understand that modules in the devices according to the embodiments may be adaptively modified and these modules may be configured in one or more devices different from the embodiments herein. Modules or units or components in the embodiments may be combined into a single module or unit or component, and additionally these modules, units or components may be practiced in a plurality of sub-modules, subunits or subcomponents. Besides that such features and/or processes or at least some of the units are mutually exclusive, all the features disclosed in this specification (including the appended claims, abstract and accompanying drawings) and all the processes or units in such disclosed methods or devices may be combined in any way. Unless otherwise stated, each of the features disclosed in this specification (including the appended claims, abstract and accompanying drawings) may be replaced by a provided same, equivalent or similar substitution.

In addition, those skilled in the art shall understand that, although some embodiments described herein include some features included in other embodiments, rather than other features, a combination of the features in different embodiments signifies that the features are within the scope of the present application and different embodiments may be derived. For example, in the claims appended hereinafter, any one of the embodiments seeking protection may be practiced in any combination manner.

Embodiments of the individual components of the present application may be implemented in hardware, or in a software module running one or more processors, or in a combination thereof. It will be appreciated by those skilled in the art that, in practice, some or all of the functions of some or all of the components in the message prompting apparatus according to individual embodiments of the present application may be implemented using a microprocessor or a digital signal processor (DSP). The present application may also be implemented as an apparatus of a device program (e.g., a computer program and a computer program product) for performing a part or all of the method as described herein. Such a program implementing the present application may be stored on a computer readable medium, or may be stored in the form of one or more signals. Such a signal may be obtained by downloading it from an Internet website, or provided on a carrier signal, or provided in any other form.

Reference herein to "one embodiment", "an embodiment" or to "one or more embodiments" implies that a particular feature, structure, or characteristic described in connection with the embodiments is included in at least one embodiment of the present application. Further, it should be noted that instances of the phrase "in one embodiment" herein are not necessarily all referring to the same embodiment.

In the specification provided herein, a plenty of particular details are described. However, it can be appreciated that an embodiment of the present application may also be practiced without these particular details. In some embodiments, well known methods, structures and technologies are not illustrated in detail so as not to obscure the understanding of the specification.

It should be noted that the above embodiments illustrate rather than limit the present application, and those skilled in the art may design alternative embodiments without departing from the scope of the appended claims. In the claims, any reference sign placed between the parentheses shall not be construed as a limitation to a claim. The word "comprise" does not exclude the presence of an element or a step not listed in a claim. The word "a" or "an" used before an element does not exclude the presence of a plurality of such elements. The present application may be implemented by means of a hardware comprising several distinct elements and by means of a suitably programmed computer. In a unit claim enumerating several devices, several of the devices may be embodied by one and the same hardware item. Use of the words "first", "second", "third" and the like does not mean any ordering. Such words may be construed as naming.

What is claimed is:

1. A current sampling and holding circuit, comprising:
a canceling circuit, connected in series between a VDD terminal and a current sensor, being conducted according to a first enable signal, and configured to output a current to cancel a direct-current component in the current sensor; and
a mirroring circuit, connected in parallel, between the VDD terminal and a ground voltage, with the canceling circuit and the current sensor connected in series, being conducted according to a second enable signal inverse to the first enable signal, and configured to perform current transfer according to a current difference between a mirror current of a shunt current and an output current of the current sensor,
wherein:
when the current sampling and holding circuit is in a sampling mode, the second enable signal enables the mirroring circuit, the cancelling circuit and the current sensor to be conducted, and the cancelling circuit is configured to sample output current of the mirror circuit; and
when the current sampling and holding circuit is in a holding mode, the mirroring circuit is disconnected from the cancelling circuit and the current sensor, and the cancelling circuit is configured to sample the output current of the current sensor.

2. The current sampling and holding circuit according to claim 1, further comprising: a second switch (S2); wherein one terminal of the second switch (S2) is connected to the canceling circuit and the other terminal of the second switch (S2) is connected to the current sensor, wherein the second switch (S2) is configured to turn on according to the first enable signal to conduct the canceling circuit, or the second switch (S2) is configured to turn off when the first enable signal is to disconnect the canceling circuit.

3. The current sampling and holding circuit according to claim 2, further comprising: a third switch (S3); wherein one terminal of the third switch (S3) is connected to the current sensor and the second switch (S2) and the other terminal of the third switch (S3) is connected to the mirroring circuit, wherein the third switch (S3) is configured to turn on according to the second enable signal to conduct the mirroring circuit, or the third switch (S3) is configured to turn off when the second enable signal is to disconnect the mirroring circuit.

4. The current sampling and holding circuit according to claim 1, wherein the mirroring circuit comprises: a first current mirror circuit, a second current mirror circuit, a third current mirror circuit, and a fourth current mirror circuit; wherein the first current mirror circuit and the second current mirror circuit are connected in series between the VDD terminal and the ground voltage, one terminal of the third current mirror circuit is connected to the first current mirror circuit and the other terminal of the third current mirror circuit is connected to the ground voltage, and one terminal of the fourth current mirror circuit is connected to the VDD terminal and the other terminal of the fourth current mirror circuit is connected to the second current mirror circuit.

5. The current sampling and holding circuit according to claim 4, wherein the mirroring circuit comprises: a fourth P-type MOS transistor (M4), a fifth P-type MOS transistor (M5), a sixth N-type MOS transistor (M6), a seventh N-type MOS transistor (M7), an eighth N-type MOS transistor (M8), a ninth N-type MOS transistor (M9), a tenth P-type MOS transistor (M10), and an eleventh P-type MOS transistor (M11); wherein a source of the fourth P-type MOS transistor (M4) is connected to the VDD terminal, a gate of the fourth P-type MOS transistor (M4) is connected to the mirroring circuit and a drain of the fourth P-type MOS transistor (M4), and the drain of the fourth P-type MOS transistor (M4) is connected to a drain and a gate of the sixth N-type MOS transistor (M6); the gate of the sixth N-type MOS transistor (M6) is further connected to the mirroring circuit, and a source of the sixth N-type MOS transistor (M6) is connected to the ground voltage; a source of the fifth P-type MOS transistor (M5) is connected to the VDD terminal, a gate of the fifth P-type MOS transistor (M5) is connected to the gate and the drain of the fourth P-type MOS transistor (M4), and a drain of the fifth P-type MOS transistor (M5) is connected to a drain of the eighth N-type MOS transistor (M8) and one terminal of the third switch (S3); the fifth P-type MOS transistor (M5) is configured to mirror the fourth P-type MOS transistor (M4); a source of the seventh N-type MOS transistor (M7) is connected to the ground voltage, a gate of the seventh N-type MOS transistor (M7) is connected to the gate and the drain of the sixth N-type MOS transistor (M6), a drain of the seventh N-type MOS transistor (M7) is connected to a drain and a current output terminal of the eleventh P-type MOS transistor (M11); the seventh N-type MOS transistor (M7) is configured to mirror the sixth N-type MOS transistor (M6); a source of the eighth N-type MOS transistor (M8) is connected to the ground voltage, a gate of the eighth N-type MOS transistor (M8) is connected to a gate of the ninth N-type MOS transistor (M9); a source of the ninth N-type MOS transistor (M9) is connected to the ground voltage, and a drain of the ninth N-type MOS transistor (M9) is connected to a drain and a gate of the tenth P-type MOS transistor (M10); the ninth N-type MOS transistor (M9) is configured to mirror the eighth N-type MOS transistor (M8); a source of the tenth P-type MOS transistor (M10) is connected to the VDD terminal, and the gate of the tenth P-type MOS transistor (M10) is connected to a gate of the eleventh P-type MOS transistor (M11); a source of the eleventh P-type MOS transistor (M11) is connected to the VDD terminal; and the eleventh P-type MOS transistor (M11) is configured to mirror the tenth P-type MOS transistor (M10).

6. A signal acquisition system having a current sampling and holding circuit, comprising: a current sampling and holding circuit and a current sensor; wherein the current sampling and holding circuit comprises:
   a canceling circuit, connected in series between a VDD terminal and a current sensor, being conducted according to a first enable signal, and configured to output a current to cancel a direct-current component in the current sensor; and
   a mirroring circuit, connected in parallel, between the VDD terminal and a ground voltage, with the canceling circuit and the current sensor connected in series, and being conducted according to a second enable signal inverse to the first enable signal, and configured to perform current transfer according to a current difference between a mirror current of a shunt current and an output current of the current sensor,
   wherein:
      when the current sampling and holding circuit is in a sampling mode, the second enable signal enables the mirroring circuit, the cancelling circuit and the current sensor to be conducted, and the cancelling circuit is configured to sample output current of the mirror circuit; and
      when the current sampling and holding circuit is in a holding mode, the mirroring circuit is disconnected from the cancelling circuit and the current sensor, and the cancelling circuit is configured to sample the output current of the current sensor.

7. The signal acquisition system according to claim 6, further comprising: a second switch (S2); wherein one terminal of the second switch (S2) is connected to the canceling circuit and the other terminal of the second switch (S2) is connected to the current sensor, wherein the second switch (S2) is configured to turn on according to the first enable signal to conduct the canceling circuit, or the second switch (S2) is configured to turn off when the first enable signal is to disconnect the canceling circuit.

8. The signal acquisition system according to claim 7, further comprising: a third switch (S3); wherein one terminal of the third switch (S3) is connected to the current sensor and the second switch (S2) and the other terminal of the third switch (S3) is connected to the mirroring circuit, wherein the third switch (S3) is configured to turn on according to the second enable signal to conduct the mirroring circuit, or the third switch (S3) is configured to turn off when the second enable signal is to disconnect the mirroring circuit.

9. The signal acquisition system according to claim 8, wherein the mirroring circuit comprises: a first current mirror circuit, a second current mirror circuit, a third current mirror circuit, and a fourth current mirror circuit; wherein the first current mirror circuit and the second current mirror circuit are connected in series between the VDD terminal and the ground voltage, one terminal of the third current mirror circuit is connected to the first current mirror circuit and the other terminal of the third current mirror circuit is connected to the ground voltage, and one terminal of the fourth current mirror circuit is connected to the VDD terminal and the other terminal of the fourth current mirror circuit is connected to the second current mirror circuit.

10. The signal acquisition system according to claim 9, wherein the mirroring circuit comprises: a fourth P-type MOS transistor (M4), a fifth P-type MOS transistor (M5), a sixth N-type MOS transistor (M6), a seventh N-type MOS transistor (M7), an eighth N-type MOS transistor (M8), a ninth N-type MOS transistor (M9), a tenth P-type MOS transistor (M10), and an eleventh P-type MOS transistor (M11); wherein a source of the fourth P-type MOS transistor (M4) is connected to the VDD terminal, a gate of the fourth P-type MOS transistor (M4) is connected to the mirroring circuit and a drain of the fourth P-type MOS transistor (M4), and the drain of the fourth P-type MOS transistor (M4) is connected to a drain and a gate of the sixth N-type MOS transistor (M6); the gate of the sixth N-type MOS transistor (M6) is further connected to the mirroring circuit, and a source of the sixth N-type MOS transistor (M6) is connected to the ground voltage; a source of the fifth P-type MOS transistor (M5) is connected to the VDD terminal, a gate of the fifth P-type MOS transistor (M5) is connected to the gate and the drain of the fourth P-type MOS transistor (M4), and a drain of the fifth P-type MOS transistor (M5) is connected to a drain of the eighth N-type MOS transistor (M8) and one terminal of the third switch (S3); the fifth P-type MOS transistor (M5) is configured to mirror the fourth P-type MOS transistor (M4); a source of the seventh N-type MOS transistor (M7) is connected to the ground voltage, a gate of the seventh N-type MOS transistor (M7) is connected to the gate and the drain of the sixth N-type MOS transistor (M6), a drain of the seventh N-type MOS transistor (M7) is connected to a drain and a current output terminal of the eleventh P-type MOS transistor (M11); the seventh N-type MOS transistor (M7) is configured to mirror the sixth N-type MOS transistor (M6); a source of the eighth N-type MOS transistor (M8) is connected to the ground voltage, a gate of the eighth N-type MOS transistor (M8) is connected to a gate of the ninth N-type MOS transistor (M9); a source of the ninth N-type MOS transistor (M9) is connected to the ground voltage, and a drain of the ninth N-type MOS transistor (M9) is connected to a drain and a gate of the tenth P-type MOS transistor (M10); the ninth N-type MOS transistor (M9) is configured to mirror the eighth N-type MOS transistor (M8); a source of the tenth P-type MOS transistor (M10) is connected to the VDD terminal, and the gate of the tenth P-type MOS transistor (M10) is connected to a gate of the eleventh P-type MOS transistor (M11); a source of the eleventh P-type MOS transistor (M11) is connected to the VDD terminal; and the eleventh P-type MOS transistor (M11) is configured to mirror the tenth P-type MOS transistor (M10).

* * * * *